(12) United States Patent
Cowles et al.

(10) Patent No.: US 7,218,561 B2
(45) Date of Patent: May 15, 2007

(54) APPARATUS AND METHOD FOR SEMICONDUCTOR DEVICE REPAIR WITH REDUCED NUMBER OF PROGRAMMABLE ELEMENTS

(75) Inventors: Timothy B. Cowles, Boise, ID (US); Todd A. Merritt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/293,946

(22) Filed: Dec. 5, 2005

(65) Prior Publication Data

US 2006/0083087 A1 Apr. 20, 2006

Related U.S. Application Data

(63) Continuation of application No. 10/862,532, filed on Jun. 7, 2004, now Pat. No. 7,006,394.

(51) Int. Cl.
*G11C 7/00* (2006.01)
(52) U.S. Cl. .................... 365/200; 365/189.07
(58) Field of Classification Search ............... 365/200
See application file for complete search history.

(56) References Cited

U.S. PATENT DOCUMENTS

| | | | |
|---|---|---|---|
| 5,387,823 A | 2/1995 | Ashizawa | |
| 5,572,470 A | 11/1996 | McClure et al. | |
| 5,691,945 A | 11/1997 | Liou et al. | |
| 5,708,619 A | 1/1998 | Gillingham | |
| 5,841,712 A | 11/1998 | Wendell et al. | |
| 5,883,842 A | 3/1999 | Miyauchi | |
| 5,920,516 A | 7/1999 | Gilliam et al. | |
| 6,240,033 B1 | 5/2001 | Yang et al. | |
| 6,285,603 B1 | 9/2001 | Ku et al. | |
| 6,480,429 B2 * | 11/2002 | Jones et al. | 365/200 |
| 6,538,934 B2 | 3/2003 | Sakata | |
| 6,571,352 B2 * | 5/2003 | Blodgett | 714/6 |
| 6,574,156 B2 | 6/2003 | Waller et al. | |
| 7,006,393 B2 * | 2/2006 | Merritt et al. | 365/200 |

* cited by examiner

*Primary Examiner*—Son L. Mai
(74) *Attorney, Agent, or Firm*—TraskBritt, PC

(57) ABSTRACT

An apparatus and method using a reduced number of non-volatile programming elements for enabling redundant memory blocks in a semiconductor memory is disclosed. A redundancy selection module may be configured using N fuses to configure and select $2^N-1$ repair modules. Programming fuses effectively separates the repair modules into two sets, those with an even address and those with an odd address. Each repair module contains fuses programmed with a selected address, such that the repair module may respond when an address input matches the selected address. However, the least significant bit is left out of the programming. As a result, repair modules in the even set respond to even addresses matching the selected address and repair modules in the odd set respond to odd addresses matching the selected address. Similar arrangements may be used to reduce the number of enable fuses and disable fuses required for each repair module.

35 Claims, 6 Drawing Sheets

APPARATUS AND METHOD FOR SEMICONDUCTOR DEVICE REPAIR WITH REDUCED NUMBER OF PROGRAMMABLE ELEMENTS

CROSS REFERENCE TO RELATED APPLICATIONS

This application is a continuation of application Ser. No. 10/862,532, filed Jun. 7, 2004, pending, which is related to application Ser. No. 10/862,284, also filed Jun. 7, 2004, now U.S. Pat. No. 7,006,394, issued Feb. 28, 2006.

BACKGROUND OF THE INVENTION

Field of the Invention

This invention relates generally to semiconductor memory circuits and particularly to circuits and methods for repairing semiconductor memory circuits having redundant memory cells.

Semiconductor memories generally include a multitude of memory cells arranged in an array of rows and columns. Each memory cell is structured for storing digital information in the form of a "1" or a "0" bit. Many semiconductor memories include extra, i.e., redundant, memory cells that may be substituted for failing memory cells. Semiconductor memories are typically tested after they are fabricated to determine if they contain any failing memory cells (i.e., cells to which bits cannot be dependably written or from which bits cannot be dependably read). Generally, when a semiconductor memory is found to contain failing memory cells, an attempt is made to repair the memory by replacing the failing memory cells with redundant memory cells provided in redundant rows or redundant columns in the semiconductor memory array.

Conventionally, when a redundant row is used to repair a semiconductor memory containing a failing memory cell, the failing cell's row address is permanently stored (typically in pre-decoded form) by programming nonvolatile elements (e.g., fuses, antifuses, Electrically Programmable Read-Only memory (EPROM), and FLASH memory cells) on the semiconductor memory. Then, during normal operation of the semiconductor memory, if the memory's addressing circuitry receives a memory address including a row address that corresponds to the row address stored on the chip, redundant circuitry in the memory causes access to a redundant row instead of the row identified by the received memory address. Since every memory cell in the failing cell's row has the same row address, the redundant row replaces every cell in the failing cell's row, both operative and failing, with the redundant memory cells in the redundant row.

Similarly, when a redundant column is used to repair the semiconductor memory, the failing cell's column address is permanently stored on the chip by programming nonvolatile elements on the chip. Then, during normal operation of the semiconductor memory, if the memory's addressing circuitry receives a memory address including a column address that corresponds to the column address stored on the chip, redundant circuitry in the memory causes a redundant memory cell in the redundant column to be accessed instead of the memory cell identified by the received memory address. Since every memory cell in the failing cell's column has the same column address, every cell in the failing cell's column, both operative and failing, is replaced by a redundant memory cell in the redundant column. This process for repairing a semiconductor memory using redundant rows and columns is well known in the art.

A typical semiconductor memory may have many redundant rows and many redundant columns, each redundant block (whether for a row or column) including its own nonvolatile programming elements for enabling and programming the address to which it will respond. As feature sizes on semiconductor devices continue to shrink, the density of memory cells on a semiconductor die continues to increase, allowing more memory cells on a semiconductor die, which in turn require more redundant rows and columns to repair the increased number of memory cells. Because of an increased number of redundant rows and columns, an increased number of nonvolatile elements are required to select each redundant row and each redundant column. Unfortunately, sizes for nonvolatile programming elements have not reduced proportionately to size reduction for memory cells. As a result, the nonvolatile programming elements take up a larger portion of the available semiconductor die area. In some designs, the nonvolatile programming elements may take up as much as five to ten percent of the overall semiconductor die area.

It would be advantageous to provide an apparatus and method using a reduced number of nonvolatile programming elements associated with repairing a semiconductor device without compromising overall ability to perform repairs, while reducing area requirements for supporting selection of redundant rows and redundant columns on a semiconductor memory device.

BRIEF SUMMARY OF THE INVENTION

One embodiment of the present invention comprises a semiconductor memory including a plurality of redundant memory blocks, a plurality of repair modules for selecting the plurality of memory blocks, and at least one redundancy selection module. The redundancy selection modules may be configured to generate select signals for selecting each of the redundant rows and redundant columns when needed to replace a normal memory row or a normal memory column, respectively. Each redundancy selection module may be configured using N nonvolatile selection elements to configure and select $2^N 31 1$ repair modules. The nonvolatile selection elements may be programmed to a boundary number value between zero and an upper boundary of $2^N$ to activate the various selection signals for each repair module. The boundary number may then be decoded into individual select signals, which divide the repair modules into two sets. A first set of repair modules has a quantity equal to the boundary number and a second set of repair modules has a quantity equal to the upper boundary less the programmed boundary number.

Each repair module contains nonvolatile address elements, which may be programmed with a selected address for that repair module, such that the repair module may respond when an address input matches the selected address. However, one address bit is removed from the programming and is defined as a configurable address bit. This configurable address bit does not have a corresponding nonvolatile address element for comparison. Instead, the, configurable address bit may be compared to select signals generated from decoding the nonvolatile selection elements. For an example, assume A0 is used as the configurable address bit. A first set of repair modules have their select signals de-asserted and may therefore respond to an even address (i.e., when A0 is de-asserted). A second set of repair modules have their select signals asserted and may therefore respond to an odd address (i.e., when A0 is asserted). This arrangement creates a savings of nonvolatile programming elements over an arrangement where a nonvolatile address element is used within each repair module for comparison to the configurable address bit. For example, if N is three, three new nonvolatile selection elements may be added to create the boundary number; however, seven (i.e., $2^N 31$ 1) nonvolatile address elements are saved because one nonvolatile address element may be removed from each repair modules, resulting in a net savings of four nonvolatile programming elements.

Each repair module may also contain a nonvolatile enable element for enabling that repair module if it is to be programmed with a selected address, such that the repair module may select a redundant memory block. However, another embodiment of the present invention comprises adding an enable boundary number programming arrangement similar to that for the configurable address bit. This may allow removal of the enable element from each repair module, creating a net savings of four additional nonvolatile programming elements in the example defined above with seven repair modules.

Another embodiment of the present invention includes a plurality of semiconductor memories incorporating the reduced fuse architecture described herein fabricated on a semiconductor wafer.

Another embodiment, in accordance with the present invention, is an electronic system comprising an input device, an output device, a processor, and a memory device. The memory device comprises at least one semiconductor memory incorporating the reduced fuse architecture described herein.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

In the following description, numerous specific details are set forth, such as specific word or byte lengths, etc., to provide a thorough understanding of the present invention. However, it will be readily apparent to those skilled in the art that the present invention may be practiced without such specific, but exemplary, details. In other instances, circuits have been shown in block diagram form in order not to obscure the present invention in unnecessary detail. Additionally, block definitions and partitioning of logic between various blocks is exemplary of a specific implementation. It will be obvious to one of ordinary skill in the art that the present invention may be practiced by numerous other partitioning solutions. For the most part, details concerning timing considerations and the like have been omitted inasmuch as such details are not necessary to obtain a complete understanding of the present invention and are within the ability of persons of ordinary skill in the relevant art.

The term "bus" is used to refer to a plurality of signals or conductors, which may be used to transfer one or more various types of information, such as data, addresses, control, or status. Additionally, a bus or collection of signals may be referred to in the singular as a signal. The terms "assert" and "negate" are respectively used when referring to the rendering of a signal, status bit, or similar apparatus into its logically true or logically false state. If the logically true state is a logic level one, the logically false state will be a logic level zero. Conversely, if the logically true state is a logic level zero, the logically false state will be a logic level one.

Different types of nonvolatile programming elements may be used to implement the present invention, such as fuses, anti-fuses, laser fuses, Flash memory cells, EPROM cells, mask options and programmable register bits. These nonvolatile programming elements may be used for various functions within the design. For ease of description and clarity, the nonvolatile programming elements may be referred to by various names such as: nonvolatile selection element 212, nonvolatile address element 312, nonvolatile enable element 332, and nonvolatile disable element 334.

Additionally, unless specified otherwise, the nonvolatile programming elements are assumed to produce a logic "1" as an asserted level when programmed and a logic "0" as a de-asserted level when left un-programmed.

Figure 1:
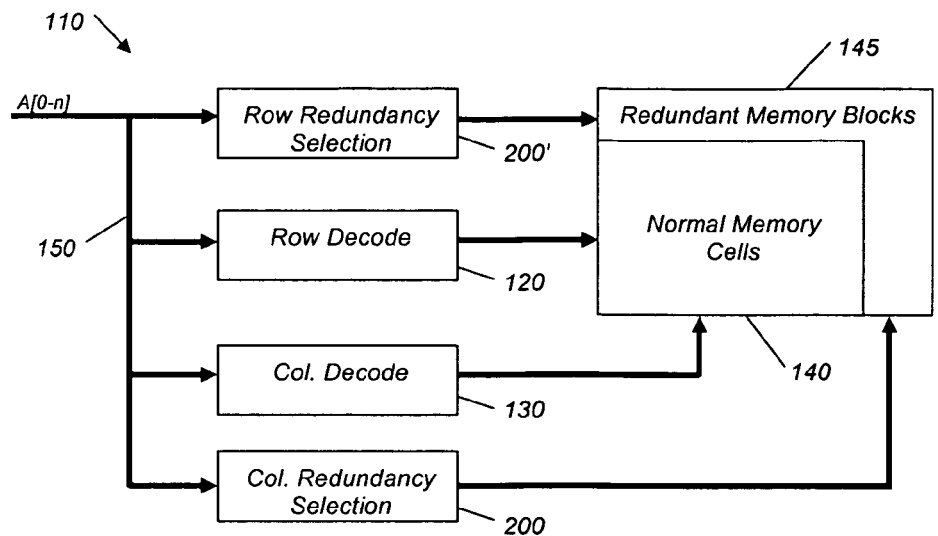
FIG. 1 is a block diagram of an exemplary memory bank in a semiconductor memory showing redundancy selection modules for selecting redundant memory blocks rather than normal memory cells.

FIG. 1 is a block diagram of an exemplary memory bank 110 in a semiconductor memory 100 (not shown) in accordance with an embodiment of the present invention. A row decode module 120 accepts address inputs 150 for decoding into select signals for each row within a normal memory cell array 140. Similarly, a column decode module 130 accepts an address input 150 for decoding into select signals for each column within the normal memory cell array 140. At least one row redundancy selection module 200' accepts address inputs 150 for decoding and comparing to selected address values such that select signals may be generated for each redundant row within the redundant memory cell array 145. Similarly, at least one column redundancy selection module 200 accepts address inputs 150 for decoding and comparing to selected address values such that select signals may be generated for each redundant column within the redundant memory cell array 145. Redundant rows and redundant columns are also referred to herein generically as redundant memory blocks 145.

The block diagram shown in FIG. 1 is illustrative of a single memory bank 110. Many modern semiconductor memories are physically organized essentially as a plurality of memory banks 10 organized as a square or rectangle of memory bits, such that multiple bits are addressed for each memory address comprised of a combined row and column address. The number of bits addressed with each memory address may vary, with exemplary amounts being 4, 8, and 16 bits per memory address. As an example memory architecture, a 512 Mbit DRAM may be separated into four banks, each bank containing 128 Mbits. Each bank may typically be configured as 8K rows. Each bank may typically comprise 16K columns, which may be organized as 4K columns of four bits, 2K columns of eight bits, or 1K columns of 16 bits. Typical memory addressing is well known to those skilled in the art, therefore, it is not described in detail herein. Additionally, the arrays of normal memory cells and redundant memory blocks 145 may be segmented into smaller portions to aid in address decoding.

Figure 2:
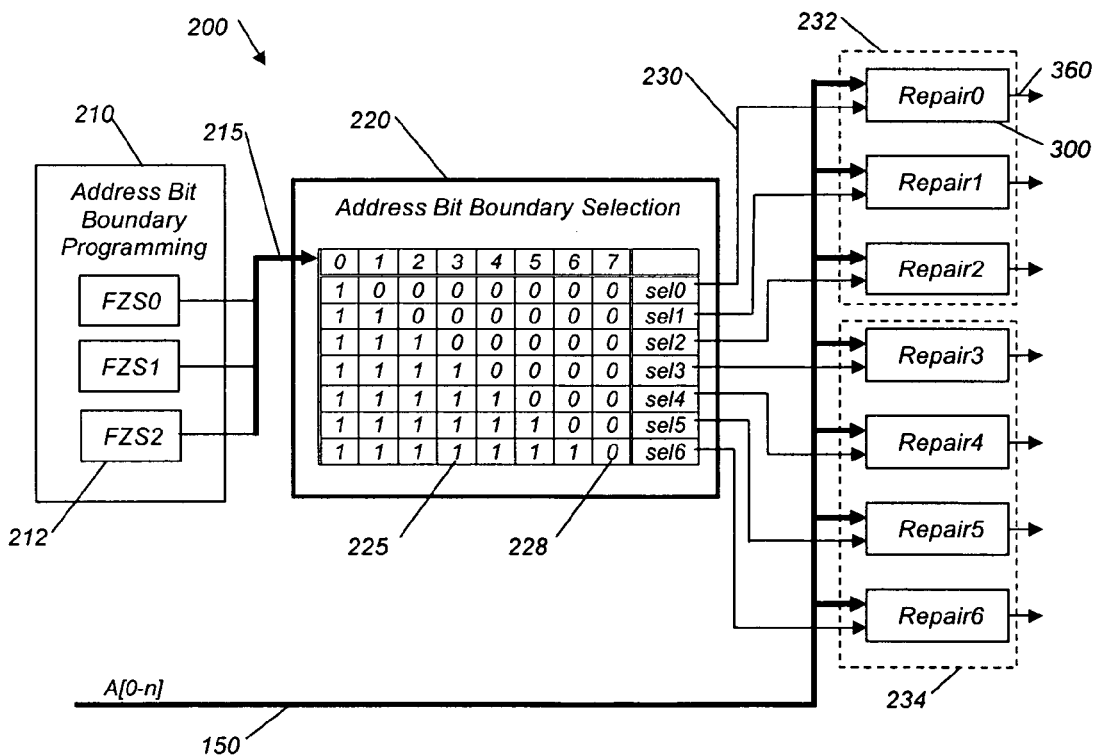
FIG. 2 is a block diagram of an exemplary redundancy selection module using nonvolatile selection element encoding.

FIG. 2 is an exemplary embodiment of a redundancy selection module 200 used to select a set of redundant memory blocks 145 (FIG. 1). Redundancy selection modules for rows and column are typically similar. Therefore, the description of redundancy selection modules 200 applies to both redundant rows and redundant columns unless specified differently herein. Each redundancy selection module 200 comprises a boundary programming module 210, a boundary selection module 220, and a plurality of repair modules 300. The boundary programming module 210 comprises a set of nonvolatile selection elements 212 for creating an encoded boundary number signal 215. The boundary selection module 220 decodes the boundary number signal 215 into separate select signals 230 for each individual repair module 300. The repair modules 300 are connected to an address input 150 bus and the separate select signals 230 generated by the boundary selection module 220. The address input 150 bus may represent all or portions of a row address or a column address depending on whether the redundant memory block that may be selected is a redundant row or a redundant column respectively. Each repair module 300 includes a match signal output 360, which may be used to select the redundant memory block in place of the normal memory block containing the faulty memory cell.

Figure 3:
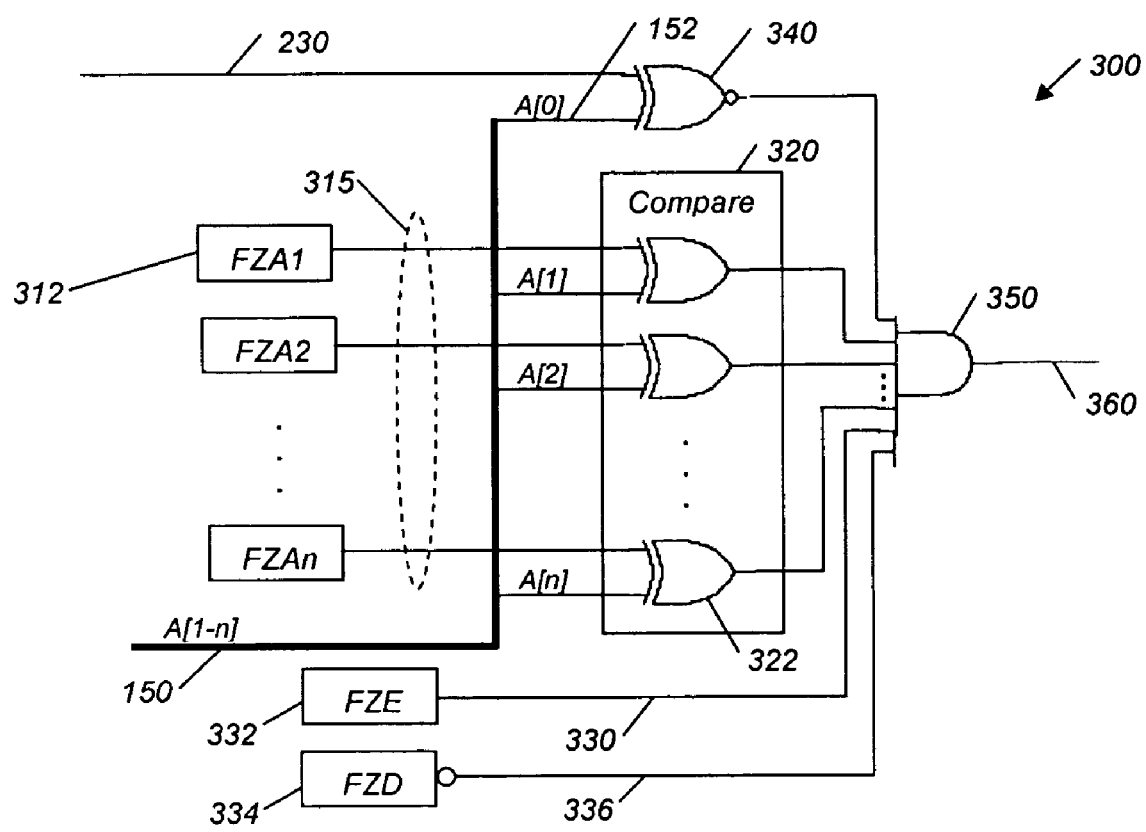
FIG. 3 is a block diagram of an exemplary repair module with nonvolatile address elements, a nonvolatile enable element, and optional nonvolatile disable element.
Figure 5:
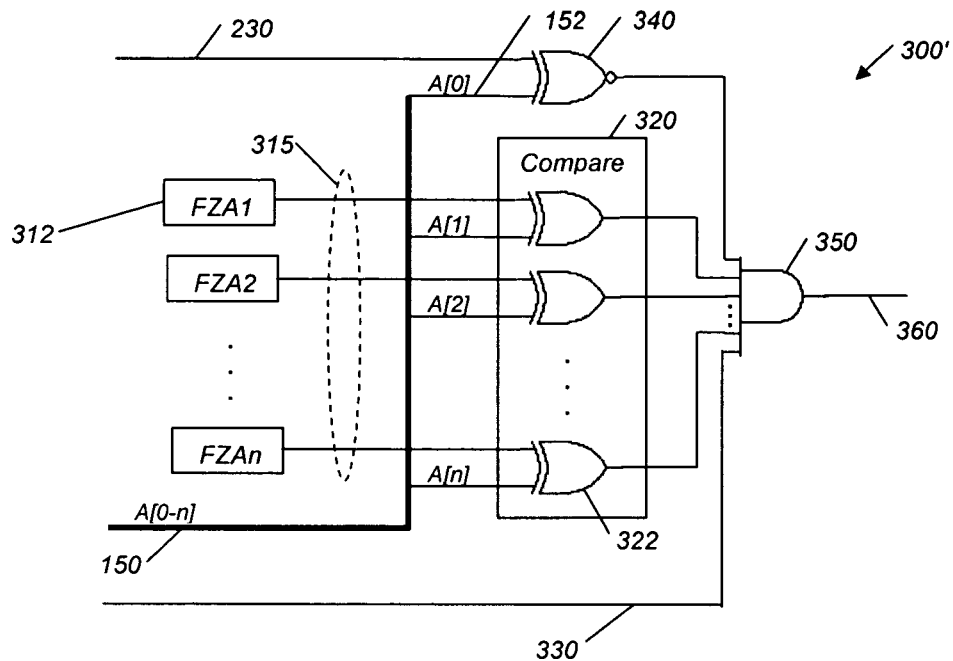
FIG. 5 is a block diagram of an exemplary repair module without a nonvolatile enable element and without a nonvolatile disable element.

Exemplary embodiments of repair modules (300 and 300') are shown respectively in FIGS. 3 and 5. In the exemplary embodiment shown in FIG. 3, each repair module 300 comprises a set of nonvolatile address elements 312, an address comparator 320, a select signal comparator 340, a combination element 350, an optional nonvolatile disable element 334 that generates an active low disable signal 336, and a nonvolatile enable element 332 that generates an enable signal 330. The select signal comparator 340 compares a select signal 230 input to the value on one of the address bits identified as a configurable address bit 152. As an example of one embodiment, FIGS. 3 and 5 show A0 as the configurable address bit 152. For all address inputs 150 to the repair module 300 other than the configurable address bit 152, individual address bit comparators 322, within the address comparator 320, compare the address input 150 bus to a selected address 315 programmed into the nonvolatile address elements 312 FZA1 through FZAn. In FIG. 5, the optional nonvolatile disable element 334 is not shown and the enable signal 330 is an input to the repair module 300', the function of which is explained more fully below.

In the embodiment shown in FIG. 3, the optional nonvolatile disable element 334, if present, is active low such that programming the nonvolatile disable element 334 generates a logic zero on the disable signal 336, which disables a match signal 360 from being asserted. When the nonvolatile disable element 334 is left unprogrammed, a logic high on the disable signal 336 allows a match signal 360 to be asserted. A nonvolatile enable element 332 within the repair module 300 drives the enable signal 330. If the nonvolatile enable element 332 is left un-programmed, the repair module 300 may be disabled such that a match signal 360 may not be asserted. If the nonvolatile enable element 332 is programmed, the combination element 350 may assert the match signal 360 when combined with a matching result from the address comparator 320 and a matching result from the select signal comparator 340. When asserted, the match signal 360 may select the redundant memory block for operation. In some memory architectures, the match signal 360 may be used to select the redundant memory block and deselect the defective memory block. In other architectures, the defective memory block may be independently disabled. Note that the combination element 350 is shown as a multi-input AND gate and the compare functions as EXCLUSIVE-OR gates to show logical function only, not physical implementation. The combination and compare functions may be implemented in many bit widths, as well as physical configurations, such as, for example, cascaded logic gates, pre-charge and evaluate type implementations, and pre-charge domino type implementations.

Within the redundancy selection module 200, as shown in FIG. 2, the nonvolatile selection elements 212 (FZS0, FZS1, and FZS2) may be programmed to represent a boundary number between zero and an upper boundary number 228 of $2^{NSE}-1$, where NSE is the number of nonvolatile selection elements 212. With three nonvolatile selection elements 212, as shown in FIG. 2, the boundary number may be programmed to a value of zero through seven. Similarly, for two nonvolatile selection elements 212 (not shown), the boundary number may be programmed to a value of zero through three and for four nonvolatile selection elements 212 (not shown), the boundary number may be programmed to a value of zero through fifteen. The number of nonvolatile programming elements may be expanded for larger groupings of repair modules 300, such as, for example, four nonvolatile selection elements 212 controlling 15 repair modules 300, or five nonvolatile selection elements 212 controlling 31 repair modules 300. In the exemplary embodiment shown in FIG. 2, the boundary number is encoded as a binary number; however, other encodings, such as, for example, Johnson or pseudo-random encodings, are possible and within the scope of the present invention.

The boundary number signal 215 connects to a boundary selection module 220 comprising decode logic for converting the encoded boundary number signal 215 into individual select signals 230 for each of the repair modules 300. In the embodiment shown in FIG. 2, the decoding is a typical priority decoder. Select signals connecting the boundary selection module 220 to a plurality of repair modules 300 may be thought of as being numbered from zero to one less than the upper boundary number 228. For example, in the embodiment shown in FIG. 2, the select signals 230 may be thought of as numbered from se10 to se16. Once a boundary number value 225 is programmed, all select signals 230 equal to or greater than the boundary number value 225 are asserted and all select signals 230 less than the boundary number value 225 are de-asserted. For example, for a boundary number of "000," all select signals 230 are asserted while for a boundary number of "111," all select signals 230 are de-asserted. As shown in FIG. 2, for a boundary number of "011," select signals 230 se13 through se16 are asserted while select signals 230 se10 through se12 are de-asserted. In other words, the encoded boundary number signal 215, in combination with the boundary selection module 220, in effect, creates two logical sets of select signals 230 connected to two logical sets of repair modules 300. As shown in FIG. 2 for a boundary number of "011," the first set of de-asserted select signals 230, comprising all select signals 230 less than the boundary number (se10 through se12), connect to a first set of repair modules 232. Similarly, a second set of asserted select signals 230, comprising all select signals 230 equal to or greater than the boundary number (se13 through se16), connect to a second set of repair modules 234. This partitioning into sets is a logical partitioning simply for the convenience of describing the present invention. Obviously, the partitioning between the first set and the second set changes for different boundary number values 225.

To configure each redundancy selection module 200 for operation, the nonvolatile address elements 312 (FZA1–FZAN) in each repair module 300 may be programmed to a unique selected address 315 representing the address of a defective normal memory block. For each repair module 300 intended to select a redundant memory block as a replacement for a defective memory block, the nonvolatile enable element 332 for that repair module 300 may also be programmed. For the entire redundancy selection module 200, the nonvolatile selection elements 212 are programmed to the desired boundary number value 225.

The programmed boundary number value 225 defines which repair modules 300 will respond to an asserted configurable address bit 152 and which repair modules 300 will respond to a de-asserted configurable address bit 152. As an example of one embodiment, FIG. 3 shows A0 as the configurable address bit 152. In this embodiment, the boundary number can be thought of as defining the first set of repair modules 232 (not shown) as those which will respond to an even address (i.e., A0 is de-asserted) and the second set of repair modules 234 (not shown) as those which will respond to an odd address (i.e., A0 is asserted). A different address bit may be selected as the configurable address bit 152 in practicing the present invention. For example, if the most significant address bit is selected, the boundary number can be thought of as defining the first set of repair modules 232 as those in the lower half of a memory block and the second set of repair modules 234 as those in the upper half of a memory block.

Returning to FIG. 3 where A0 is shown as the configurable address bit 152, in the prior art each repair module 300 contained a nonvolatile address element 312 (not shown) for matching to A0 using an address bit comparator 322 similar to the address bit comparators 322 used for the other address bits. However, the present invention takes advantage of the fact that every address input 150 is either even or odd. By removing A0 from the address comparison, a nonvolatile address element 312 is saved in each the repair modules 300. For the embodiment shown in FIG. 3, seven nonvolatile programming elements are saved. The nonvolatile selection elements 212 in the boundary programming module 210 are used instead for selecting which repair modules 300 respond to odd addresses and which repair modules 300 respond to even addresses. As a result, seven nonvolatile address elements 312 are saved and three new nonvolatile selection elements 212 are added, resulting in a savings of four nonvolatile programming elements for each redundancy selection module 200. As an example of redundant column selection, for a column address with eight address bits, the prior art used nine nonvolatile programming elements for each repair module 300 (eight for address and one for enable) for a total of 63 nonvolatile programming elements. The present invention, in the embodiment shown in FIG. 2, uses eight nonvolatile programming elements for each of the seven repair modules 300 (seven for A1–A8 and one for enable) plus three new nonvolatile programming elements for the boundary number for a total of 59 nonvolatile programming elements. A total savings of 6.3% is achieved for each redundancy selection module 200 used on the semiconductor memory 100 without sacrificing any reparability.

As an operational example, if after testing the semiconductor memory 100, five column addresses are determined to produce incorrect results, the five defective columns may be replaced by five redundant columns. Therefore, five of the seven repair modules 300 may be enabled by programming the nonvolatile enable element 332 in those five repair modules 300. For the FIG. 2 embodiment, repair modules 300 zero through four may be enabled while repair modules 300 five and six remain disabled. Each of the five defective columns has a unique address comprised of nine bits (i.e., A0–A8). After examining the five unique addresses, it is determined that three addresses are even and two addresses are odd. Using this determination, the nonvolatile selection elements 212 in the boundary programming module 210 may be programmed to the number of required even addresses. In the case of three even addresses, the boundary number may be programmed to the value of three. A boundary number of three may generate a de-asserted select signal for se10, se11, and se12 and an asserted select signal for se13, se14, se15, and se16. The state of se15 and se16 are unimportant in this example because repair modules 300 five and six are not enabled. Address bits A1–8 of the unique addresses for each defective column with an even address are programmed as the selected address 315 for each of the repair modules 300 zero, one, and two. Address bits A1–8 of the unique addresses for each defective column with and odd address are programmed as the selected address 315 for each of the repair modules 300 three and four.

After completing the programming, each repair module 300 may generate a match signal 360 only for its unique nine-bit selected address 315. For example, assume repair module two 300 is programmed to respond to an address input 150 of 32 decimal (0 0001 0000 binary). The address comparison on A1–A8 may generate a match for address inputs 150 values of 32 and 33 since the only difference between 32 and 33 is bit A0. However, since se12 is de-asserted, the repair module 300 may only generate a final match signal 360 when A0 is de-asserted. Therefore, an address input 150 of 32 may generate a match signal 360 while an address input 150 of 33 may not generate a match signal 360.

Figure 4:
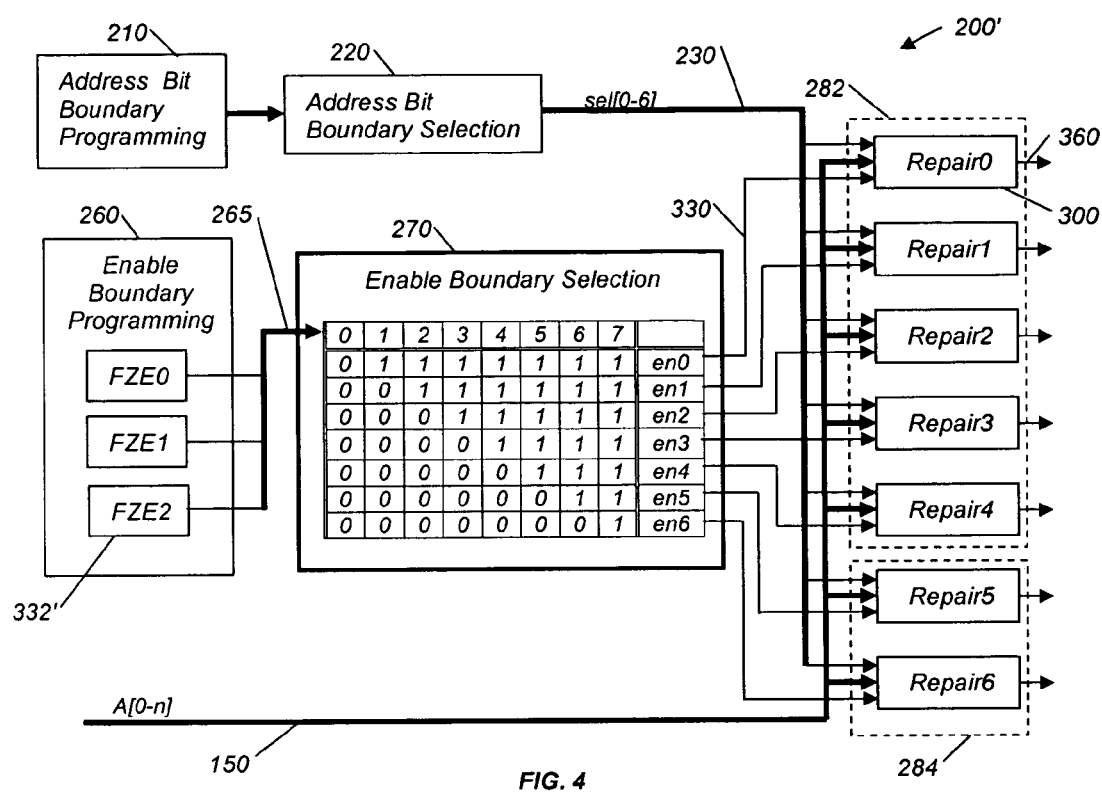
FIG. 4 is a block diagram of another exemplary redundancy selection module using nonvolatile enable element encoding.

Additional nonvolatile programming element savings are possible by using a similar boundary encoding mechanism for the enable signals 330. FIG. 4 shows an exemplary embodiment of a redundancy selection module 200' using the boundary selection for the configurable address bit 152 as described above as well as a boundary selection for the enable signals 330. The boundary programming module 210 and boundary selection module 220 for the configurable address bit 152 are shown without the internal details. An enable boundary programming module 260 and an enable boundary selection module 270 are shown generating the enable signals 330. In this exemplary embodiment, a slightly modified repair module 300' may be used. As shown in FIG. 5, the nonvolatile enable element 332 within the repair module 300' may be removed leaving the enable signal 330 as an input to the repair module 300'. Referring back to FIG. 4, the function and configuring of the enable boundary programming module 260 and enable boundary selection module 270 are similar to those described above for the configurable address bit 152. Therefore, only a brief description of configuring the boundary for the enable signals 330 is required. As an example, an enable boundary number 265 of "101," may be programmed into the nonvolatile enable elements 332' such that the enable signals 330 for a set of enabled repair modules 282 (i.e., zero through four) may be asserted and the enable signals 330 for a set of disabled repair modules 284 (i.e., five and six) may be de-asserted. As with the configurable encoded boundary number signal 215, the logical partitioning into a set of enabled repair modules 282 and a set of disabled repair modules 284 is for convenience of describing the present invention and the partitioning between the enabled set and the disabled set changes for different enable boundary number signals 265. In addition, the number of nonvolatile elements may be expanded for larger groupings of repair modules 300', such as, for example, four nonvolatile enable elements 332' controlling 15 repair modules 300', or five nonvolatile enable elements 332, controlling 31 repair modules 300'.

Of course, if desired, the reduced fuse programming using a boundary selection for the enable signals 330 may also be used separately from the reduced fuse programming using a boundary selection for a configurable address bit 152.

In some other embodiments, each repair module 300 may have the nonvolatile disable element 334. The disable function may be needed in a case where a redundant memory block contains a faulty memory bit and should therefore be disabled from being a candidate for use as a redundant memory block. In addition, the disable function may be needed if a fault or error occurs in the attempt to program a repair module 300. For any given repair module 300, the disable function may override any other nonvolatile element programming within that repair module 300.

Figure 6:
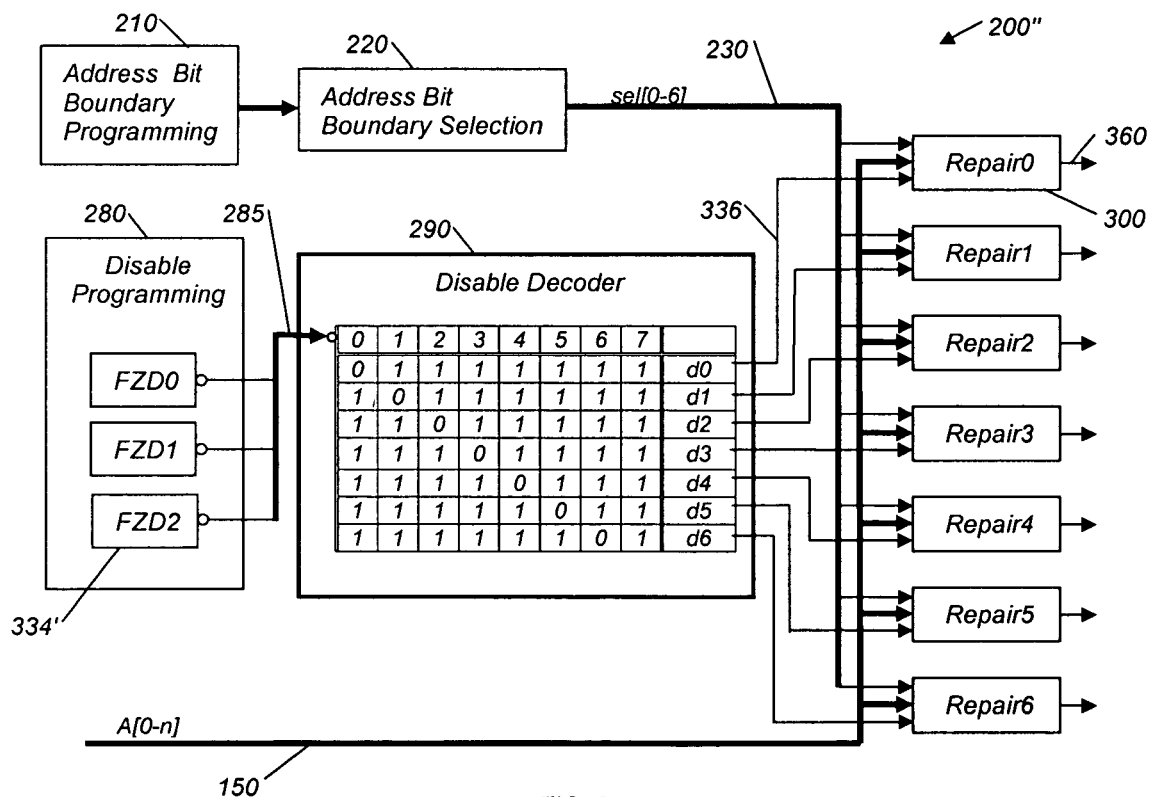
FIG. 6 is a block diagram of another exemplary redundancy selection module using nonvolatile disable element encoding.

The disable function may also be encoded for a group of repair modules 300. FIG. 6 shows an exemplary embodiment using the boundary selection for the configurable address bit 152 as described above, as well as a disable selection for the disable signals 336. The boundary programming module 210 and boundary selection module 220 for the configurable address bit 152 are shown without the internal details. A disable programming module 280 and a disable decoder 290 are shown generating the disable signals 336. In this exemplary embodiment, the repair module 300 of FIG. 3 may be used without the optional nonvolatile disable element 334, such that the disable signal 336 is an input to the repair module 300.

As shown in FIG. 6, the disable function for one of a group of repair modules 300 may be binary encoded using a simple "one-hot" decoding to select one of the repair modules 300 to be disabled. This encoding mechanism results in a savings of seven disable fuses and an addition of three encoded disable fuses for a net savings of four nonvolatile programming elements. The nonvolatile disable elements 334' are active low such that programming generates a logic zero. As a result, the disable decoder 290 decodes active low signals. Similarly, the disable signals 336 are active low. Accordingly, the disable decoder 290 generates a logic low for the decoded disable signal 336 and a logic one for all other disable signals.

For example, in a redundancy selection module 200" configured with seven repair modules 300, the disable programming module 280 uses three nonvolatile disable elements 334' to generate a disable number 285. If repair module three 300 or redundant memory block three 145 contains a defect, "100" may be programmed into the three nonvolatile disable elements 334' to disable repair module three 300 while leaving all other repair modules 300 available. In other words, FZD0 and FZD1 are programmed, and FZD2 remains un-programmed.

Typically, not more than one repair module 300 in a group of seven would require disabling. However, a second group of three may be added to disable a second repair module 300 and still result in a net savings of one nonvolatile disable element (i.e., 2*3 encoded elements added, 7 individual elements removed). Obviously, the binary encoding of disable elements can be expanded for larger groupings of repair modules 300, such as, for example, 15 or 31 repair modules 300 within a redundancy selection module 200.

Figure 7:
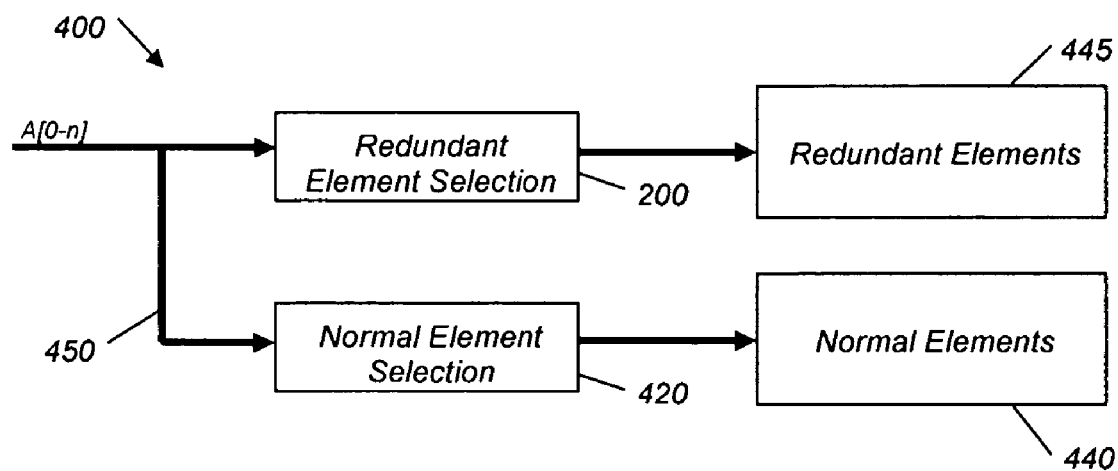
FIG. 7 is a block diagram of a repair apparatus according to another exemplary embodiment of the invention.

Embodiments of the present invention have been described in relation to semiconductor memories including redundant memory cells. However, the present invention is applicable as a repair apparatus in other systems and devices where a reduced number of programmable elements are desired. FIG. 7 illustrates a repair apparatus 400 according to another exemplary embodiment of the invention. The repair apparatus 400 includes normal elements 440, redundant elements 445, a normal selection module 420, a redundant selection module 200, and an address input bus 450. In the FIG. 7 embodiment, redundant elements may include memory rows, memory columns, memory arrays, register files, execution units, and processors.

As examples, in fault tolerant systems containing redundant processors, the present invention may be used to disable certain processors from operation or participation in a voting process. Alternatively, the present invention may be used to select redundant processors in place of normal processors. In another example, processors may contain normal execution units and redundant execution units, such as arithmetic logic units and the like. The present invention may select redundant execution units to replace faulty execution units. Similarly, a processor may contain redundant register files to replace faulty register files. Moreover, the term faulty may be defined as producing a desired result too slowly, rather than incorrectly. As a result, it may be desirable to select redundant elements, such as, for example, execution units or redundant register files, which may operate faster than normal execution units or normal register files may operate.

Figure 8:
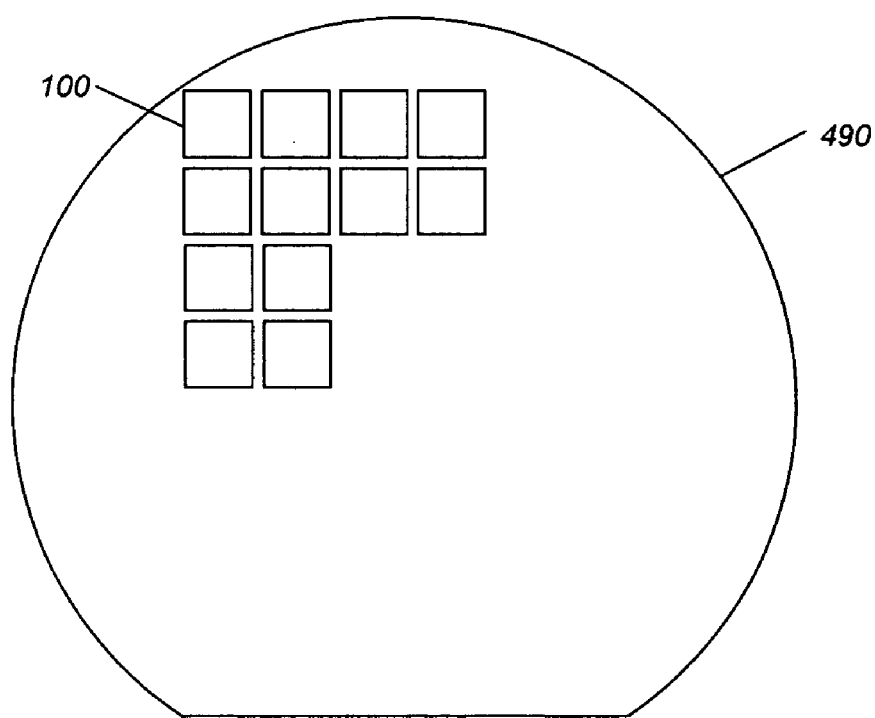
FIG. 8 is a semiconductor wafer containing a plurality of semiconductor memories containing redundancy selection modules.

As shown in FIG. 8, a semiconductor wafer 490, in accordance with the present invention, includes a plurality of semiconductor memories 100 incorporating the reduced fuse architecture described herein. Of course, it should be understood that the semiconductor memories 100 may be fabricated on substrates other than a silicon wafer, such as, for example, a Silicon On Insulator (SOI) substrate, a Silicon On Glass (SOG) substrate, and a Silicon On Sapphire (SOS) substrate.

Figure 9:
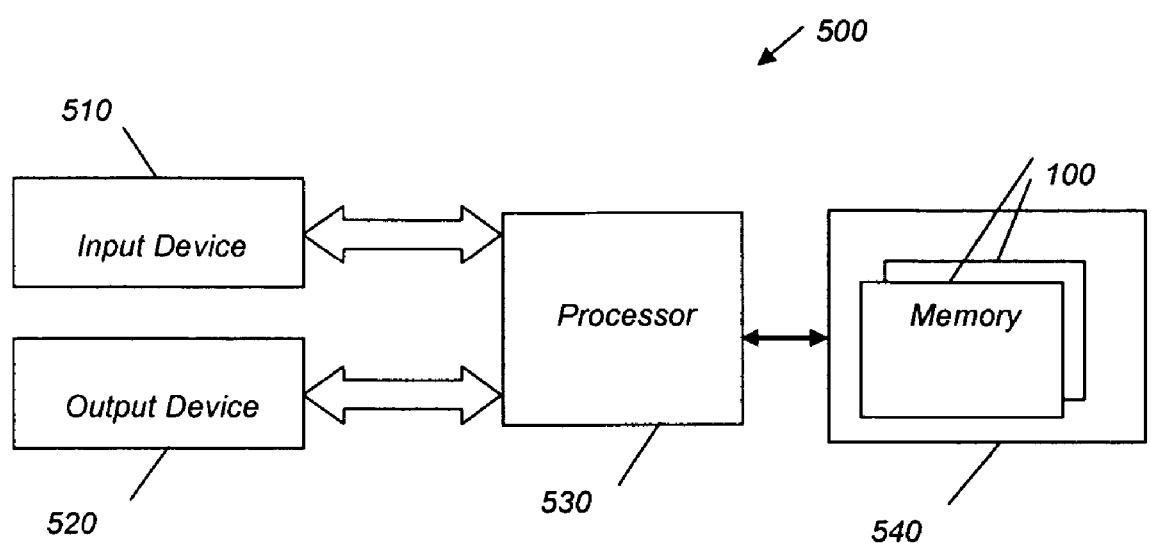
FIG. 9 is a computing system diagram showing a plurality of semiconductor memories containing redundancy selection modules.

As shown in FIG. 9, an electronic system 500, in accordance with the present invention, comprises an input device 510, an output device 520, a processor 530, and a memory device 540. The memory device 540 comprises at least one semiconductor memory 100 incorporating the reduced fuse architecture described herein in a DRAM device. It should be understood that the semiconductor memory 100 might comprise a wide variety of devices other than a DRAM, including, for example, Static RAM (SRAM) devices and Flash memory devices.

Although this invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A repair apparatus for selecting a plurality of redundant elements, comprising:
   at least one configurable address bit;
   a first set of repair modules, wherein each repair module in the first set of repair modules may be configured to select one of the plurality of redundant elements when the at least one configurable address bit is de-asserted;
   a second set of repair modules, wherein each repair module in the second set of repair modules may be configured to select one of the plurality of redundant elements when the at least one configurable address bit is asserted; and
   at least one redundancy selection module configured for programming a boundary number, wherein the boundary number defines the number of repair modules in the first set of repair modules, and the number of repair modules in the second set of repair modules.

2. The repair apparatus of claim 1, wherein the boundary number may be programmed as an encoding selected from the group consisting of a binary encoding, a Johnson encoding and a pseudo-random encoding.

3. The repair apparatus of claim 1, wherein the at least one redundancy selection module comprises:
   a plurality of N nonvolatile selection elements configured for programming the boundary number; and
   a boundary selection module, wherein the boundary number may be decoded to select a quantity of repair modules equal to the boundary number as the first set of repair modules, and select a quantity of repair modules equal to $2^N-1$ less the boundary number as the second set of repair modules.

4. The repair apparatus of claim 3, wherein the plurality of N nonvolatile selection elements is selected from the group consisting of fuses, anti-fuses, laser fuses, Flash memory cells, EPROM cells, mask options, and programmable register bits.

5. The repair apparatus of claim 1, wherein each repair module in the first set of repair modules and the second set of repair modules comprises:
   a plurality of nonvolatile address elements configured for programming a selected address; and
   a select signal configured to indicate a repair module is in the first set of repair modules when the select signal is de-asserted or in the second set of repair modules when the select signal is asserted;
   wherein each repair module may select one of the plurality of redundant elements when an address input corresponds with the selected address, and the at least one configurable address bit corresponds with the select signal.

6. The repair apparatus of claim 5, wherein the plurality of nonvolatile address elements is selected from the group consisting of fuses, anti-fuses, laser fuses, Flash memory cells, EPROM cells, mask options, and programmable register bits.

7. The repair apparatus of claim 5, wherein each repair module further comprises an enable signal wherein each repair module may only select the one of the plurality of redundant elements if the enable signal is asserted.

8. The repair apparatus of claim 7, wherein each repair module in the first set of repair modules and the second set of repair modules further comprise a nonvolatile enable element configured for programming the enable signal.

9. The repair apparatus of claim 1, further comprising:
   a plurality of nonvolatile enable elements configured for programming an enable boundary number, wherein the enable boundary number defines a set of enabled repair modules that may be enabled for selecting one of the plurality of redundant elements and a set of disabled repair modules that are disabled from selecting one of the plurality of redundant elements.

10. The repair apparatus of claim 9, wherein each repair module in the first set of repair modules and the second set of repair modules comprises:
    a plurality of nonvolatile address elements configured for programming a selected address; and
    a select signal configured to indicate a repair module is in the first set of repair modules when the select signal is de-asserted or in the second set of repair modules when the select signal is asserted,
    wherein each repair module in the first set of repair modules and the second set of repair modules may select one of the plurality of redundant elements when the repair module is enabled, an address input corresponds with the selected address, and the at least one configurable address bit corresponds with the select signal.

11. The repair apparatus of claim 10, wherein the plurality of nonvolatile enable elements and the plurality of nonvolatile address elements are selected from the group consisting of fuses, anti-fuses, laser fuses, Flash memory cells, EPROM cells, mask options, and programmable register bits.

12. The repair apparatus of claim 1, wherein the plurality of redundant elements is selected from the group consisting of memory rows, memory columns, memory arrays, register files, execution units, and processors.

13. A semiconductor device including a repair apparatus for selecting a plurality of redundant elements, comprising:
    at least one configurable address bit;
    a first set of repair modules, wherein each repair module in the first set of repair modules may be configured to select one of the plurality of redundant elements when the at least one configurable address bit is de-asserted;
    a second set of repair modules, wherein each repair module in the second set of repair modules may be configured to select one of the plurality of redundant elements when the at least one configurable address bit is asserted; and
    at least one redundancy selection module configured for programming a boundary number, wherein the boundary number defines the number of repair modules in the first set of repair modules, and the number of repair modules in the second set of repair modules.

14. The semiconductor device of claim 13, wherein the boundary number may be programmed as an encoding selected from the group consisting of a binary encoding, a Johnson encoding and a pseudo-random encoding.

15. The semiconductor device of claim 13, wherein the at least one redundancy selection module further comprises:
    a plurality of N nonvolatile selection elements configured for programming the boundary number; and
    a boundary selection module, wherein the boundary number may be decoded to select a quantity of repair modules equal to the boundary number as the first set of repair modules, and select a quantity of repair modules equal to $2^N-1$ less the boundary number as the second set of repair modules.

16. The semiconductor device of claim 15, wherein the plurality of N nonvolatile selection elements are selected from the group consisting of fuses, anti-fuses, laser fuses, Flash memory cells, EPROM cells, mask options, and programmable register bits.

17. The semiconductor device of claim 13, wherein each repair module in the first set of repair modules and the second set of repair modules comprises:
- a plurality of nonvolatile address elements configured for programming a selected address; and
- a select signal configured to indicate a repair module is in the first set of repair modules when the select signal is de-asserted or in the second set of repair modules when the select signal is asserted;
- wherein each repair module may select one of the plurality of redundant elements when an address input corresponds with the selected address, and the at least one configurable address bit corresponds with the select signal.

18. The semiconductor device of claim 17, wherein the plurality of nonvolatile address elements are selected from the group consisting of fuses, anti-fuses, laser fuses, Flash memory cells, EPROM cells, mask options, and programmable register bits.

19. The semiconductor device of claim 17, wherein each repair module further comprises an enable signal wherein each repair module may only select the one of the plurality of redundant elements if the enable signal is asserted.

20. The semiconductor device of claim 19, wherein each repair module in the first set of repair modules and the second set of repair modules further comprise a nonvolatile enable element configured for programming the enable signal.

21. The semiconductor device of claim 13, further comprising:
- a plurality of nonvolatile enable elements configured for programming an enable boundary number, wherein the enable boundary number defines a set of enabled repair modules that may be enabled for selecting one of the plurality of redundant memory blocks and a set of disabled repair modules that are disabled from selecting one of the plurality of redundant memory blocks.

22. The semiconductor device of claim 21, wherein each repair module in the first set of repair modules and the second set of repair modules comprises:
- a plurality of nonvolatile address elements configured for programming a selected address; and
- a select signal configured to indicate a repair module is in the first set of repair modules when the select signal is de-asserted or in the second set of repair modules when the select signal is asserted,
- wherein each repair module in the first set of repair modules and the second set of repair modules may select one of the plurality of redundant memory blocks when the repair module is enabled, an address input corresponds with the selected address, and the at least one configurable address bit corresponds with the select signal.

23. The semiconductor device of claim 22, wherein the plurality of nonvolatile enable elements and the plurality of nonvolatile address elements are selected from the group consisting of fuses, anti-fuses, laser fuses, Flash memory cells, EPROM cells, mask options, and programmable register bits.

24. The semiconductor device of claim 13, wherein the plurality of redundant elements is selected from the group consisting of memory rows, memory columns, memory arrays, register files, execution units, and processors.

25. A method for controlling selection of a plurality of redundant elements, comprising:
- defining at least one configurable address bit;
- configuring a first set of repair modules, each repair module in the first set configured to be responsive when a de-asserted level is present on the at least one configurable address bit and an address input matches a selected address configured for that repair module; and
- configuring a second set of repair modules, each repair module in the second set configured to be responsive when an asserted level is present on the at least one configurable address bit and the address input matches a selected address configured for that repair module.

26. The method of claim 25, wherein the plurality of redundant elements to be controlled are selected from the group consisting of memory rows, memory columns, memory arrays, register files, execution units, and processors.

27. The method of claim 25, wherein:
- configuring the first set of repair modules further comprises, programming a plurality of nonvolatile address elements to a value representing the selected address for that repair module; and
- configuring the second set of repair modules further comprises, programming a plurality of nonvolatile address elements to a value representing the selected address for that repair module.

28. The method of claim 25, further comprising:
- programming a plurality of N nonvolatile selection elements to represent a boundary number wherein, the first set of repair modules comprises a quantity of repair modules equal to the boundary number; and the second set of repair modules comprises a quantity of repair modules equal to $2^N-1$ less the boundary number.

29. The method of claim 28, wherein the boundary number may be programmed as an encoding selected from the group consisting of a binary encoding, a Johnson encoding and a pseudo-random encoding.

30. The method of claim 25, further comprising programming a plurality of NE nonvolatile enable elements to represent an enable boundary number, wherein the enable boundary number defines a set of enabled repair modules equal to the enable boundary number and a set of disabled repair modules equal to $2^{NE}31$ 1 less the enable boundary number.

31. The method of claim 25, further comprising programming a nonvolatile enable element corresponding to each repair module in the first set of repair modules and the second set of repair modules, wherein each repair module may be enabled when the nonvolatile enable element corresponding to that repair module is programmed.

32. The method of claim 31, further comprising programming a nonvolatile disable element corresponding to each repair module in the first set of repair modules and the second set of repair modules, wherein each repair module may be disabled when the nonvolatile enable element corresponding to that repair module is programmed.

33. The method of claim 31, further comprising programming a plurality of nonvolatile disable elements to represent a disable number, wherein the disable number may be decoded to disable one of the repair modules in the first set of repair modules and the second set of repair modules.

34. A semiconductor wafer, comprising:
- at least one semiconductor device including an apparatus for selecting a plurality of redundant elements, the apparatus comprising:
  - at least one configurable address bit;
  - a first set of repair modules, wherein each repair module in the first set of repair modules may be configured to select one of the plurality of redundant elements when the at least one configurable address bit is de-asserted; and a second set of repair modules, wherein each repair module in the second set of repair modules may be configured to select one of the plurality of redundant elements when the at least one configurable address bit is asserted; and at least one redundancy selection module configured for programming a boundary number, wherein the boundary number defines the number of repair modules in the first set of repair modules, and the number of repair modules in the second set of repair modules.

35. An electronic system, comprising:

at least one input device;

at least one output device;

a processor; and a memory device comprising, at least one semiconductor memory including an apparatus for selecting a plurality of redundant elements, the apparatus comprising:

at least one configurable address bit;

a first set of repair modules, wherein each repair module in the first set of repair modules may be configured to select one of the plurality of redundant elements when the at least one configurable address bit is de-asserted; and a second set of repair modules, wherein each repair module in the second set of repair modules may be configured to select one of the plurality of redundant elements when the at least one configurable address bit is asserted; and at least one redundancy selection module configured for programming a boundary number, wherein the boundary number defines the number repair modules in the first set of repair modules, and the number of repair modules in the second set of repair modules.

* * * * *

UNITED STATES PATENT AND TRADEMARK OFFICE
CERTIFICATE OF CORRECTION

PATENT NO.        : 7,218,561 B2
APPLICATION NO.   : 11/293946
DATED             : May 15, 2007
INVENTOR(S)       : Cowles et al.

It is certified that error appears in the above-identified patent and that said Letters Patent is hereby corrected as shown below:

In column 14, line 39, in Claim 30, delete "$2^{NE}31\ 1$" and insert -- $2^{NE}-1$ --, therefor.

Signed and Sealed this

Eighth Day of April, 2008

JON W. DUDAS
*Director of the United States Patent and Trademark Office*